United States Patent [19]

Tolliver

[11] 3,965,400

[45] June 22, 1976

[54] CORONA GENERATING DEVICE WITH IMPROVED BUILT-IN CLEANING MECHANISM

[75] Inventor: Peter M. Tolliver, Rochester, N.Y.

[73] Assignee: Xerox Corporation, Stamford, Conn.

[22] Filed: Feb. 24, 1975

[21] Appl. No.: 552,476

[52] U.S. Cl. .............................. 317/262 A; 250/324

[51] Int. Cl.$^2$ .............................. H01J 37/26

[58] Field of Search .............................. 317/262 A, 4; 250/324–326

[56] References Cited

UNITED STATES PATENTS

| | | | |
|---|---|---|---|
| 3,842,273 | 10/1974 | Buskirk | 317/262 A X |
| 3,891,846 | 6/1975 | Ito | 317/262 A X |

OTHER PUBLICATIONS

IBM Technical Disclosure Bulletin; *Corona Unit Cleaning Device;* W. F. Voit, Jr., vol. 11, No. 8, 1-69.

*Primary Examiner*—R. N. Envall, Jr.
*Attorney, Agent, or Firm*—B. A. Chiama; Earl T. Reichert

[57] ABSTRACT

A corona generating device having a corona wire and a shield partially surrounding the wire has an improved built-in cleaning mechanism. The cleaning mechanism includes a cleaning member slidably mounted within the shield, which member is driven back and forth along the device by a belt connected thereto. The belt is driven by a pulley rotatably mounted on the device, the pulley having gear teeth formed therein which are adapted to mesh with a drive gear. By using conventional quick-disconnect electrical connectors to connect the corona wire to a source of voltage, and a suitable supporting member to both support the device and position the pulley so that it meshes with the drive gear, the device can be easily removed from an electrostatic reproduction machine for routine maintenance, and easily inserted back into the machine.

2 Claims, 2 Drawing Figures

CORONA GENERATING DEVICE WITH IMPROVED BUILT-IN CLEANING MECHANISM

BACKGROUND OF THE INVENTION

This invention relates generally to an improvement in an electrostatic reproduction machine, but more particularly to an improved corona generating device for such a machine.

In the practice of xerography as described in U.S. Pat. No. 2,297,691 to Chester F. Carlson, a xerographic surface comprising a layer of photoconductive insulating material affixed to a conductive backing is used to support electrostatic images. In the usual method of carrying out the process, the xerographic plate is electrostatically charged uniformly over its surface, and then exposed to a light pattern of the image being reproduced to thereby discharge the charge in the areas where light strikes the layer. The undischarged areas of the layer thus form an electrostatic charge pattern or electrostatic latent image in conformity with the configuration of the original pattern.

The latent electrostatic image is developed by contacting it with a finely divided electrostatically attractable material, such as a resinous powder. The powder is held in the image areas by the electrostatic fields on the layer. Where the field is greatest, the greatest amount of material is deposited, and where the field is least, little or no material is deposited. Thus, a powder image is produced in conformity with the image of the original being produced. The powder image is subsequently transferred to a sheet of paper or other transfer member, and suitably affixed thereto to form a permanent copy.

The latest concept for electrostatic reproduction machines utilizes high speed flash exposure of the document, and a moving photoconductive material in the form of an endless belt which is continuously charged. Additionally, such reproduction machines are provided with a developing system which supplies toner particles in relatively large quantities for solid area coverage, such as a magnetic brush developing apparatus. Thus, after the belt passes the magnetic brush assembly, for example, a xerographic powder image is formed on the belt which corresponds to the electrostatic latent image. This powder image is then transferred to a support surface (e.g., a sheet of paper) to which it is fused by a fusing assembly whereby the powder image is caused to adhere to the support surface permanently.

The latest electrostatic reproduction machines are high speed machines which print copies at a rate substantially in excess of any previous electrostatic reproduction machine, and are intended to compete with other types of printing machines, e.g., offset printing machines. Because of this, it is desired that the quality of the copies made, be extremely high. Important to high quality copies are effective corona generating devices. Numerous corona generating devices are used in such high speed machines. For example, a corona generating device is used to initially place a charge on the photoreceptor prior to exposure. Corona generating devices are also used prior to the transfer operation to place an appropriate charge on the background so as to prevent or minimize the transfer of background particles. In some machines, corona generating devices are also used to effect the transfer operation. After the transfer operation, corona generating devices are also used to detack the transfer member from the photoreceptor, and to place an appropriate charge on the photoreceptor so as to loosen any residual toner on the photoreceptor so that it may be more easily removed with a brush cleaning apparatus. Thus, as can be seen, corona generating devices are very important to the proper operation of such machines. Many corona generating devices have or must have conductive shields; to keep such corona generating devices operating most effectively, it is highly important that toner be efficiently removed at periodic intervals, because toner accumulations on either the shield or corona wire affect the operation of the devices. The efficiency of a corona generating device decreases substantially as the density of dust accumulation on the device increases. As a result there is a sharp decrease in the quality of the copies made.

Thus, to ensure high efficiency, the corona generating device requires frequent cleaning and maintenance. For example, in order to maintain the entire machine operating effectively it has been necessary to clean corona generating devices completely after several hundred reproductions, and even sooner with machines operating at very high rates. In many instances, this requires removing corona generating devices from a machine, and cleaning the entire assemblies including wires, and shields with a suitable cleaning solution. Needless to say, this is a time consuming operation, and requires that the machine be out of operation for a considerable period of time.

On many reproduction machines manufactured today, however, the corona generating devices have built-in mechanisms for cleaning the wires, or both the wires and shields. The prior art discloses various arrangements for doing this. U.S. Pat. Nos. 2,614,901 and 3,496,362 and IBM Technical Disclosure Bulletin (Vol. 11, No. 8, p. 1025, January, 1969) all show various arrangements for cleaning corona wires only. Offenlegungsschrift 2,302,212 shows an arrangement for manually cleaning both the wire and shield of a corona generating device. U.S. patent applications, Ser. Nos. 367,607 and 400,077, assigned to Xerox Corporation, discloses additional arrangements for cleaning both the wire and shield of a corona generating device, the former being intended for manual operation, and the latter for automatic operation. For the high speed reproduction machines presently being manufactured, corona generating devices must be provided with built-in cleaning mechanisms for cleaning the wires and shields in order to utilize the machines most efficiently and produce good quality copies. Preferably, such cleaning mechanisms should be electrically operated (e.g., by a motor) instead of manually operated. Because such high speed machines are highly complex mechanisms having thousands of parts, Xerox, the assignee of the instant application, makes every effort to reduce costs wherever possible, and to efficiently utilize whatever space is available in the machines. Thus, what is needed is a corona generating device having an improved built-in cleaning mechanism, which mechanism can be motor or automatically driven, occupies a minimum amount of space, has a minimum number of parts, is relatively economical to manufacture, and permits one to readily remove the device from the machine for routine maintenance.

SUMMARY OF THE INVENTION

To accomplish the objectives set foth in the previous sentence, the present invention is directed to corona generating device having an improved built-in cleaning mechanism for cleaning both the wire and shield. The cleaning mechanism is comprised of at least one cleaning member mounted upon a carriage, the latter being slidably mounted within the shield so that the cleaning member preferably contacts both the corona wire and shield. The mechanism also includes a pulley-gear arrangement to move the brush back and forth along the corona generating device. A drive gear meshes with and drives a pulley-gear rotatably mounted on the corona generating device. A recess or trough is formed in the periphery of the pulley-gear so as to accept a belt. The belt is supported by the pulley-gear and by an idler pulley which is also rotatably mounted on the corona generating device and the ends of the belt are suitably connected to the carriage within the shield. Thus, the pulley-gear serves as both a gear and a pulley, and when driven by the drive gear, causes the belt, and consequently the cleaning member, to move along the corona generating device so as to clean the latter.

DETAILED DESCRIPTION OF THE INVENTION

Figure 1:
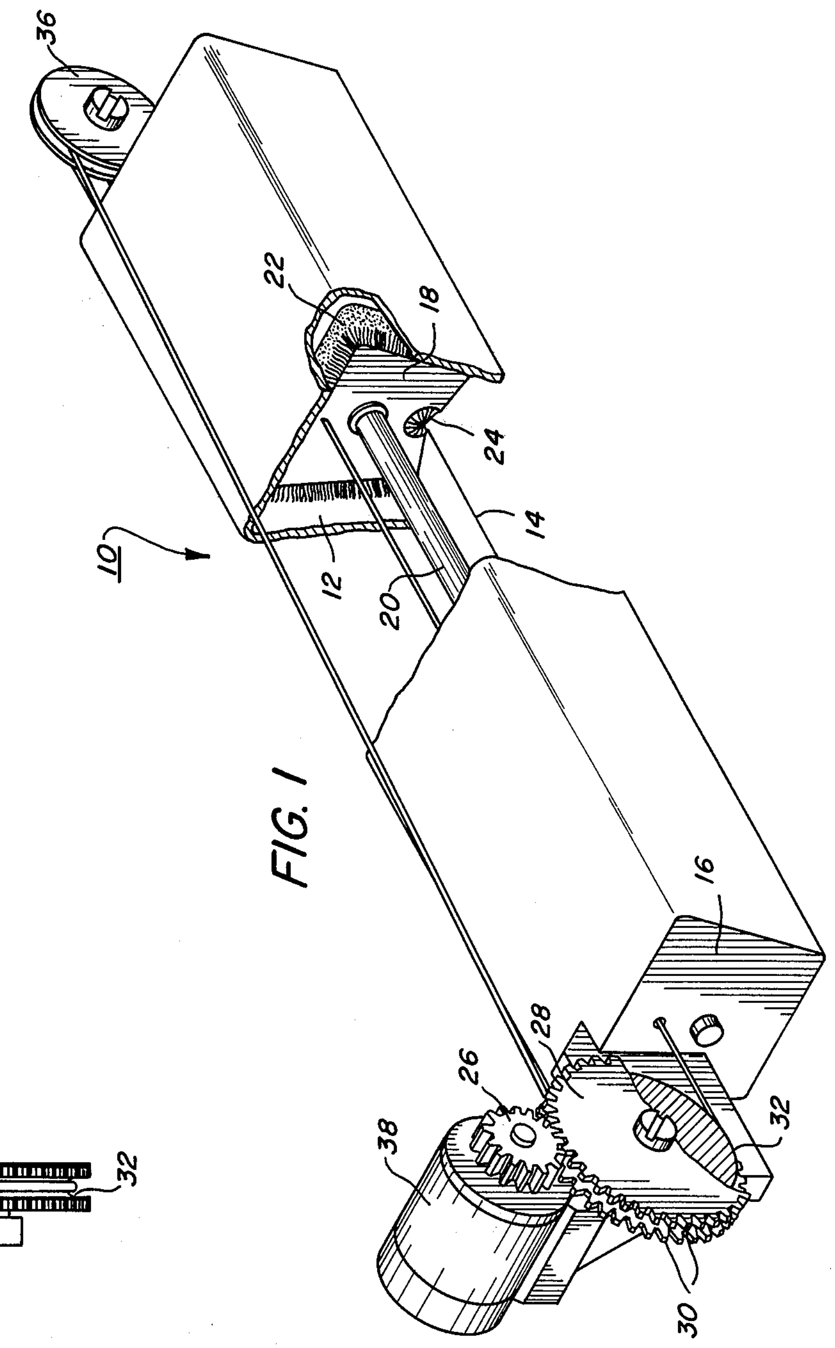
FIG. 1 is a perspective view of a corona generating device incorporating the principles of the invention.

Referring to FIG. 1, a conventional corona generating device 10 is illustrated, the device having a conductive and generally U-shaped shield 12 partially surrounding a corona wire 14. The corona wire is supported by insulating end blocks 16 which have suitable connecting means for connecting the wire to a suitable source of voltage. The problems arising from an accumulation of dust on a corona generating device are well known and have been set forth in the above mentioned references and patent applications.

A carriage 18 is slidably mounted on at least one dielectric rod 20, the rod being suitably supported by the end blocks 16. The carriage 18 supports a brush 22 for cleaning the entire inner surface of the shield 12, and a brush 24 for cleaning the corona wire 14.

Figure 2:
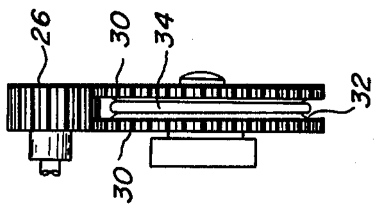
FIG. 2 is an end view of the gear/pulley-gear mechanism showing the belt in the recess of the meshed gears.

To move the carriage 18 and brushes 22 and 24 back and forth along the inside of the shield, a drive gear 26 meshes with a pulley-gear 28, the latter having teeth 30 formed around its periphery and a recess or trough 32 formed between the teeth. A belt 34 is supported by the pulley-gear 28 and an idler pulley 36, each of the latter two members being rotatably mounted on the corona generating device 10 by any suitably means. As can be seen in FIG. 2, the recess 32 must be deep enough to accept the belt 34 and keep the latter out of contact with the drive gear 26 during operation. Thus, the drive gear 26 drives the pulley-gear 28, moving the belt 34 and consequently the carriage 18 and brushes 22 and 24 along the corona generating device 10. Any suitable means, e.g., a reversible motor 38, may be used to rotate the drive gear 26 in opposite directions.

By providing the device 10 with conventional electrical connectors which will mate with connectors in a reproduction machine, the device can be removed from the machine quite easily for routine maintenance; any suitable mounting means may be utilized to locate and support the device so that the pulley-gear 28 readily meshes with the drive gear 26 when the device is inserted into the machine. Thus, the corona generating device 10 can be easily inserted into and removed from a reproduction machine.

While the invention has been described with reference to the structure disclosed, it is not confined to the details set forth, but is intended to cover such modifications or changes as may come within the scope of the following claims.

What is claimed is:

1. An improved cleaning mechanism for a corona generating device, the device having an elongated generally U-shaped shield and a corona wire mounted within and extending along the shield, wherein the improvement comprises:

a. cleaning means in contact with the corona wire and slidably mounted within the shield so as to be movable along the latter;

b. a first circular member rotatably mounted on one end of the device and a second circular member rotatably mounted on the other end of the device, means forming a recess around the periphery of each of the circular memebers, and means forming gear teeth around the periphery of the first member on each side of the recess therein;

c. a length of belt mounted in and supported by the recesses of the cirular members, the ends of the belt being connected to opposite sides of the cleaning member; and d. drive gear means having gear teeth meshing with the gear teeth of the first circular member.

2. The improved cleaning mechanism set forth in claim 1, wherein the cleaning means is also in contact with the shield.

* * * * *